(12) United States Patent
Chong et al.

(10) Patent No.: US 7,725,755 B1
(45) Date of Patent: May 25, 2010

(54) SELF-COMPENSATING DELAY CHAIN FOR MULTIPLE-DATE-RATE INTERFACES

(75) Inventors: Yan Chong, Mountain View, CA (US);
Chiakang Sung, Milpitas, CA (US);
Bonnie I. Wang, Cupertino, CA (US);
Joseph Huang, San Jose, CA (US);
Xiaobao Wang, Santa Clara, CA (US);
Philip Pan, Fremont, CA (US);
Tzung-Chin Chang, San Jose, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 11/668,353

(22) Filed: Jan. 29, 2007

Related U.S. Application Data

(62) Division of application No. 10/037,861, filed on Jan. 2, 2002, now Pat. No. 7,200,769.

(60) Provisional application No. 60/315,985, filed on Aug. 29, 2001, provisional application No. 60/315,876, filed on Aug. 29, 2001.

(51) Int. Cl.
*G06F 1/00* (2006.01)
*G06F 1/14* (2006.01)

(52) U.S. Cl. .............. 713/500; 713/501; 713/502; 327/273

(58) Field of Classification Search .......... 713/320, 713/500, 501, 502; 327/273
See application file for complete search history.

(56) References Cited

U.S. PATENT DOCUMENTS

| | | | | |
|---|---|---|---|---|
| 6,140,854 A * | 10/2000 | Coddington et al. | ........ | 327/158 |
| 6,279,073 B1 * | 8/2001 | McCracken et al. | ......... | 711/105 |
| 6,316,980 B1 * | 11/2001 | Vogt et al. | ................... | 327/273 |
| 6,466,491 B2 * | 10/2002 | Yanagawa | .................... | 365/194 |
| 6,522,182 B2 * | 2/2003 | Tomita et al. | ............... | 327/158 |
| 6,525,585 B1 * | 2/2003 | Iida et al. | ..................... | 327/279 |
| 7,017,070 B1 * | 3/2006 | Ho et al. | ..................... | 713/503 |
| 7,139,347 B2 * | 11/2006 | Fujita et al. | ................. | 375/371 |
| 2001/0028267 A1 * | 10/2001 | Kobayashi et al. | .......... | 327/277 |
| 2002/0196883 A1 * | 12/2002 | Best et al. | .................... | 375/355 |

\* cited by examiner

*Primary Examiner*—Thomas Lee
*Assistant Examiner*—Vincent T Tran
(74) *Attorney, Agent, or Firm*—Townsend and Townsend and Crew LLP; J. Matthew Zigmant

(57) ABSTRACT

Methods and apparatus for delaying a clock signal for a multiple-data-rate interface. An apparatus provides an integrated circuit including a frequency divider configured to receive a first clock signal and a first variable-delay block configured to receive an output from the frequency divider. Also included is a phase detector configured to receive the first clock signal and an output from the first variable-delay block, and an up/down counter configured to receive an output from the phase detector. A second variable-delay block is configured to receive a second clock signal and a plurality of flip-flops are configured to receive an output from the second variable-delay block. The first variable-delay block and the second variable-delay block are configured to receive an output from the up/down counter.

32 Claims, 15 Drawing Sheets

SELF-COMPENSATING DELAY CHAIN FOR MULTIPLE-DATE-RATE INTERFACES

CROSS-REFERENCES TO RELATED APPLICATIONS

This application is a divisional of U.S. patent application Ser. No. 10/037,861, filed Jan. 2, 2002, now U.S. Pat. No. 7,200,769, which claims the benefit of U.S. Provisional Applications No. 60/315,876 filed Aug. 29, 2001, and No. 60/315,985 filed Aug. 29, 2001, both of which are hereby incorporated by reference in their entirety.

This application is related to commonly-assigned U.S. patent application Ser. No. 10/038,737, filed Jan. 2, 2002, now U.S. Pat. No. 6,806,733, titled "Multiple Data Rate Interface Architecture" by Pan et al., which is hereby incorporated by reference in its entirety.

BACKGROUND OF THE INVENTION

The present invention relates in general to integrated circuit input/output (I/O) interfaces, and in particular to methods and circuitry for accurately phase shifting clock signals in a multiple-data-rate interface.

Various interfaces have been developed to increase data transfer rates and data throughput between integrated circuits. In a multiple-data-rate interface scheme, two or more bits of data are transferred during each clock period. A specific example is double-data-rate (DDR) technology, which performs two data operations in one clock cycle and achieves twice the data throughput. This technology has enhanced the bandwidth performance of integrated circuits used in a wide array of applications from computers to communication systems. The DDR technique is employed in, for example, synchronous dynamic random access memory (SDRAM) circuits.

DDR interfaces process I/O data (also referred to as DQ signals) using both the rising edge and falling edges of a clock signal DQS that functions as a data strobe to control the timing of data transfers. DQS is normally edge-aligned with DQ for a DDR interface operating in read mode (i.e., when receiving data at the DQS). For optimum data sampling, DQS is delayed by one-quarter of a clock period so that there is a 90 degree phase shift between the edges of DQ and DQS. This ensures that the DQS edge occurs close to the center of the DQ pulse. It is desirable to implement this 90 degree phase shift in a way that is as accurate and as stable as possible. But typical phase shift techniques that use, for example, delay chains, are highly susceptible to process, voltage, temperature, and other variations. In addition, typical DDR timing specifications require a wide frequency range of operation from, e.g., 133 MHz to 200 MHz. This places further demands on the performance of the phase shift circuitry.

To ensure proper data transfer at multiple-data-rate interfaces, it is desirable to devise methods and apparatus for phase shifting clock signals in an accurate and stable manner.

SUMMARY OF THE INVENTION

The present invention provides methods and circuitry for delaying data timing control signals in high-speed multiple-data-rate interface architectures.

In one embodiment, a system clock signal is delayed by approximately one cycle or 360 degrees by a series of variable-delay buffers. A phase detector having the system clock signal and delayed system clock signal as inputs determines which has a first arriving edge. Based on this, an up/down counter is incremented or decremented. The count sets a delay through the series of variable-delay buffers, and the phase detector changes the count in such a direction that the delay is adjusted to be approximately one clock cycle.

In a specific embodiment, a data timing control or DQS signal is a burst clock signal that is active when data is received at the DQ pins, and while it has the same frequency as the system clock, they have an indeterminate phase relationship. At least one matching variable-delay buffer is placed in the DQS signal path. Specifically, approximately one-fourth the number of buffers in the series of variable-delay buffers is used, which provides a phase shift to the DQS signal of approximately one-fourth a clock cycle or 90 degrees.

One exemplary embodiment of the present invention provides an apparatus for delaying a clock signal for a multiple-data-rate interface. The apparatus provides an integrated circuit including a frequency divider configured to receive a first clock signal and a first variable-delay block configured to receive an output from the frequency divider. Also included is a phase detector configured to receive the first clock signal and an output from the first variable-delay block and an up/down counter configured to receive an output from the phase detector. A second variable-delay block is configured to receive a second clock signal and a plurality of flip-flops are configured to receive an output from the second variable-delay block. The first variable-delay block and the second variable-delay block are configured to receive an output from the up/down counter.

Another exemplary embodiment of the present invention provides a method of delaying a clock signal in a multiple-data-rate interface. This method includes receiving a first clock signal, the first clock signal transitioning between a first logic level and a second logic level, and generating a second clock signal by delaying the first clock signal by a first duration, the second clock signal transitioning between the first logic level and the second logic level. It is then determined whether the first clock signal transitions from the first logic level to the second logic level before the second clock signal transitions from the first logic level to the second logic level. If it does, the first duration is increased. If not, the first duration is decreased. A third clock signal is received and a fourth clock signal is generated by delaying the third clock signal by a second duration. In a double-data rate system, the second duration is approximately equal to one-quarter the first duration.

A further exemplary embodiment of the present invention provides a method of delaying a clock signal in a multiple-data-rate interface. This method includes receiving a first clock signal, the first clock signal transitioning between a first logic level and a second logic level and generating a second clock signal by delaying the first clock signal by a first duration and dividing the frequency of the first clock signal, the second clock signal transitioning between a first logic level and a second logic level. It is then determined if the first clock signal transitions from the first logic level to the second logic level before the second clock signal transitions from the first logic level to the second logic level. If it does, the first duration is increased. If not, the first duration is decreased. A third clock signal is received and a fourth clock signal is generated by delaying the third clock signal by a second duration. In a double-date rate interface, the second duration is approximately equal to one-quarter the first duration.

In a specific embodiment, the frequency of the first clock signal is divided, and the result is delayed. In an alternate embodiment, the first clock signal is delayed, and then the frequency of the resulting signal is divided.

In yet a further exemplary embodiment of the present invention, another integrated circuit is provided. This integrated circuit includes a series of circuits and a phase detector having a first input connected to an input of the series of circuits and a second input connected to an output of the series of circuits. An up/down counter having an input is connected to an output of the phase detector, and a first variable-delay block having a control input is connected to an output of the up/down counter.

The series of circuits includes a second variable-delay block having a control input connected to the output of the up/down counter, and a frequency divider. In a specific embodiment, the variable-delay block is connected to an output of the frequency divider. In an alternative embodiment, the frequency divider is connected to an output of the variable-delay block.

A better understanding of the nature and advantages of the present invention may be gained with reference to the following detailed description and the accompanying drawings.

DESCRIPTION OF SPECIFIC EMBODIMENTS

Figure 1:
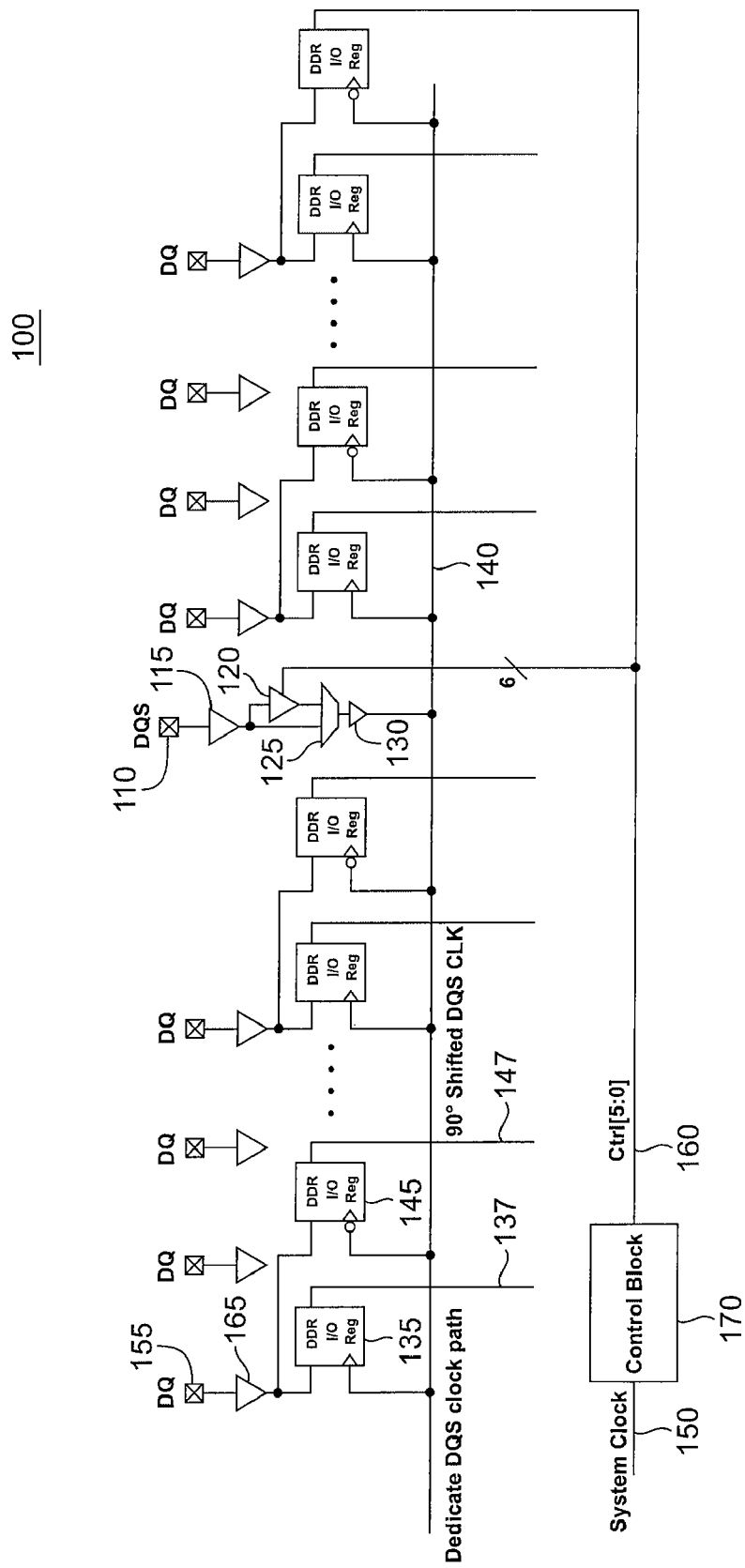
FIG. 1 is a schematic showing a DDR interface consistent with an exemplary embodiment of the present invention.

FIG. 1 is a schematic showing a double-data rate (DDR) interface consistent with an embodiment of the present invention. This figure, as with all the included figures, is shown for illustrative purposes, and does not limit either the possible applications of embodiments of the present invention or the claims. It is further to be understood that embodiments of the present invention are described in the context of a DDR system for illustrative purposes only, and that systems employing higher data rates may also incorporate embodiments of the present invention. The interface shown may be included in an integrated circuit, for example, a programmable logic device.

In the exemplary embodiments shown, there are eight DQ lines 155 for sending and receiving data, and one DQS lines 110 for receiving a clock signal. These lines may be pads that connect to package pins of an integrated circuit. Alternately, they may be internal traces on an integrated circuit. Each DQ line 155 connects to a buffer 165 which in turn is connected to a pair of flip-flops 135 and 145. DQS line 110 connects to buffer 115, which drives a variable-delay buffer 120 and multiplexer 125. Multiplexer 125 selects between the output of buffer 115 or the output of variable-delay buffer 120, and provides an output signal to buffer 130. Multiplexer 123 may be controlled by a bit in a programmable memory by an internal control line, or by other appropriate means. Output buffer 130 in turn drives the clock input of flip-flop 135 and the clock bar input of flip-flop 145. Flip-flops 135 and 145 output data on lines 137 and 147. Line 150 provides a system clock to control block 170, which generates control bits on bus 160 that connects to variable-delay buffer 120. Output lines 137 and 147 may connect to data inputs of a static random-access memory (SRAM) or SDRAM. Alternately, they may connect to other circuitry, such as a first-in first-out (FIFO) or other type of memory, logic, or circuitry.

Typically, the system clock signal on line 150 is continuous. That is, the clock signal alternates or transitions between a first level and a second level generally whenever power is applied to the circuit. This clock signal may be gated or otherwise controlled, for example, it may be enabled by other signals from this or other circuits.

The DQS signal on line 110 is a burst clock that has an undetermined phase relationship with (i.e., is asynchronous to) the system clock on line 150. In a specific embodiment, the DQS signal on line 110 has the same or approximately the same frequency as the system clock on line 150. In other embodiments, one signal may be a harmonic or have a frequency that is a multiple of the other signal's frequency. For example, the DQS signal on line 110 may have a frequency that is twice the frequency (i.e., be the second harmonic) of the system clock on line 150. DQS alternates between a first level and a second level when data is received on lines 155, and is otherwise at a high impedance (i.e., high-z, or tristate) condition. The frequency of the DQS signal may vary over a wide range. For example, a specific embodiment is designed to receive input clock signals at 133 MHz, 166 MHz, or 200 MHz. In the DDR embodiment, data applied at the DQ lines 155 have a data rate that is twice the clock frequency. In this way, data at the DQ lines 155 is stored at rising edges of the clock by flip-flop 135 and on the falling edges by flip-flop 145.

In DDR applications, the edges of data transitions at the DQ lines 155 are aligned to the edges of the clock signal at the DQS line 110. To facilitate the storing of data by flip-flops 135 and 145, it is desired that the clock signal provided to the flip-flops 135 and 145 is phase shifted or delayed by 90 degrees, such that it is in quadrature with the data at DQ lines 155 and the DQS signal on line 110. Accordingly, the delay of variable-delay buffer 120 is adjusted such that the clock signal on line 140 is 90 degrees behind the clock signal applied to DQS pin 110. That is, the clock signal on line 140 is delayed one-quarter cycle relative to the DQS signal. For additional flexibility the variable-delay buffer 120 may be bypassed by selecting the appropriate input of multiplexer 125. This is useful, for example, in applications where the DQS signal is already shifted by 90 degrees relative to the data.

Each signal line shown may be single ended or differential. For example, the buffer 130 may have differential outputs, where an output connects to a clock input of flip-flop 135 and a complementary output connects to a clock bar input of flip-flop 145.

One skilled in the relevant art appreciates that this block diagram may be drawn differently. For example, the buffers 165 may be eliminated or incorporated into the flip-flops 135 and 145. Again, the flexibility provided by multiplexer 125 may be optional, and as such it may be removed in some embodiments. As a further example, the buffer 130 may be eliminated or subsumed into the multiplexer 125 or variable-delay buffer 120.

In a specific embodiment, each of these circuits is made using a complementary-metal-oxide-silicon (CMOS) process. In alternate embodiments, they may be made using a bipolar, BiCMOS, silicon germanium (SiGe), gallium arsenide (GaAs) or other III-V process, or other appropriate technology.

Figure 2:
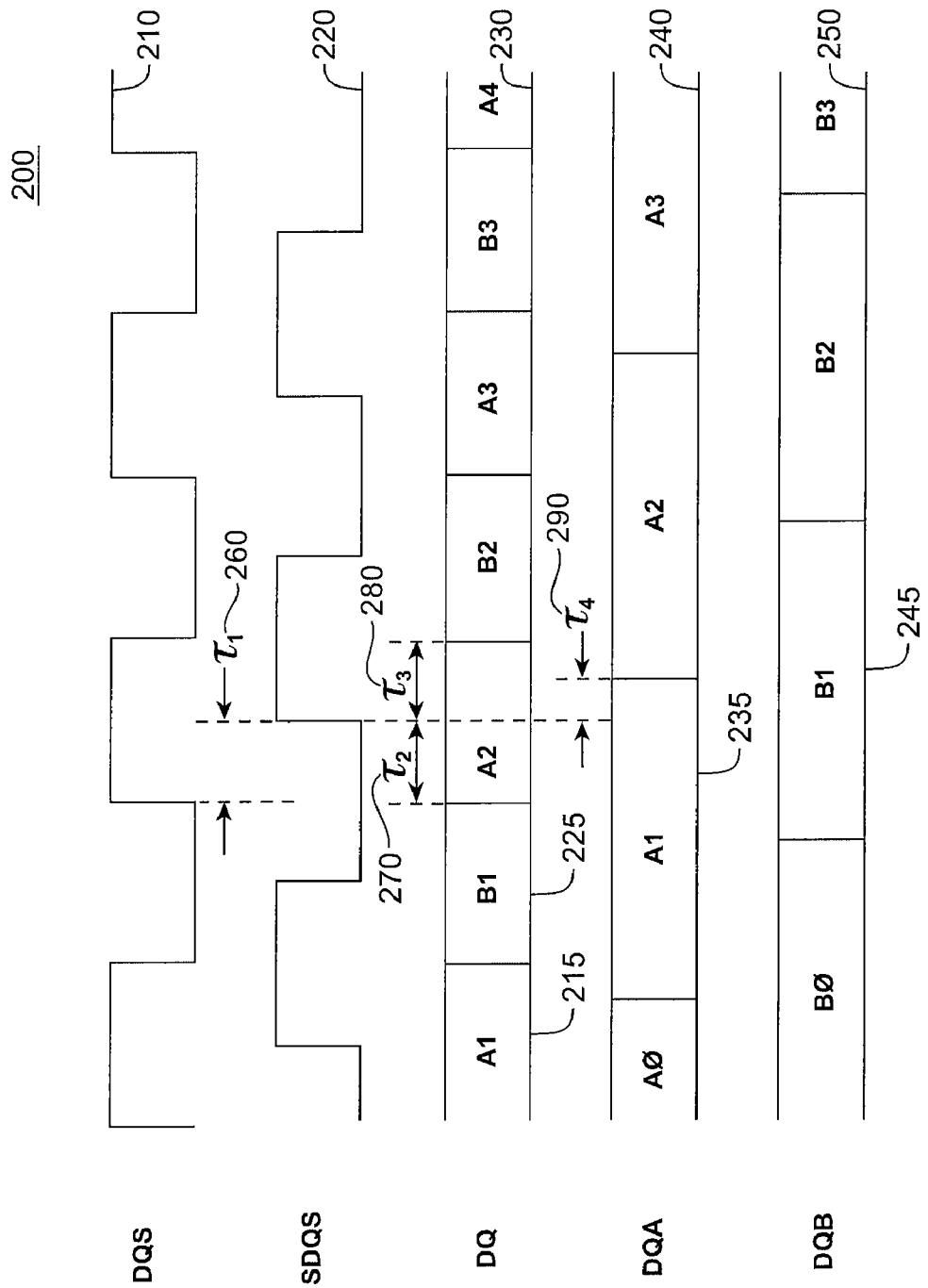
FIG. 2 is a timing diagram for the DDR interface of FIG. 1.

FIG. 2 is a timing diagram 200 for the DDR interface of FIG. 1. Included are DQS input clock signal 210, delayed clock signal SDQS 220, input data signal 230, and data outputs DQA 240 and DQB 250. The clock signal DQS 210 alternates between a first level and a second level. Delayed clock signal SDQS 220 is shifted relative to DQS 210 by a duration $t_1$ 260, which corresponds to 90 degrees, or one-quarter a DQS clock cycle. Data signal DQ 230 is made up of data bits such as A1 215 and B1 225. A1 215 and B1 225 may have the same polarity—or logic level or they may have the opposite polarity. They each may be either at the first level or the second level. Typically, the edges of the DQ signal 230 are approximately aligned to the edges of the DQS signal 210. Clocking the DQ signal 230 with SDQS signal 220 allows for a maximum set-up time $t_2$ 270 and hold time $t_3$ 280, thus facilitating the storing of the data in flip-flops 135 and 145. Moving a clock edge to the middle of a data bit in this way is referred to as window centering. The two flip-flops 135 and 145 provide de-interleaved outputs on lines 137 and 147. Specifically, signal DQA 240 includes every other bit, shown here as the "A" bits, (such as A1 235), while data at DQB provides the other alternating data bits (such as B1 245). A change in DQA 240 follows a rising edge of SDQS 220 by a delay $t_4$ 240. A change in DQB 250 follows a falling edge of SDQS 220 by a similar duration.

Each of the signals in this and other included timing diagrams are capable of alternating at least between a first logic level and a second logic level. The first logic level may be what is commonly referred to as a logic low, while the second logic level may be a logic high. Alternately, the first logic level may be a high and the second logic level a low. The first logic level for each signal may be substantially the same voltage. This is often true in CMOS devices, for example, where the logic levels roughly correspond to the supply voltage and ground. Alternately, the first logic levels may have different voltage levels for some or all signals. This is often true in circuits made using a bipolar-CMOS (BiCMOS) process, or where different circuits are powered at different supply voltages. In a BiCMOS device, bipolar logic circuits may use one set of voltages for the first and second logic levels, while CMOS logic circuits use another. Similarly, the second logic levels of each signal may have substantially the same voltage, or some or all may have a different voltage.

Each signal may be single ended or differential. For some differential signals, when a signal is at a first logic level, its complement is at the second logic level. For other differential signals, the complementary signal is at a DC voltage that is between the voltage of the first logic level and the voltage of the second logic level.

Figure 3:
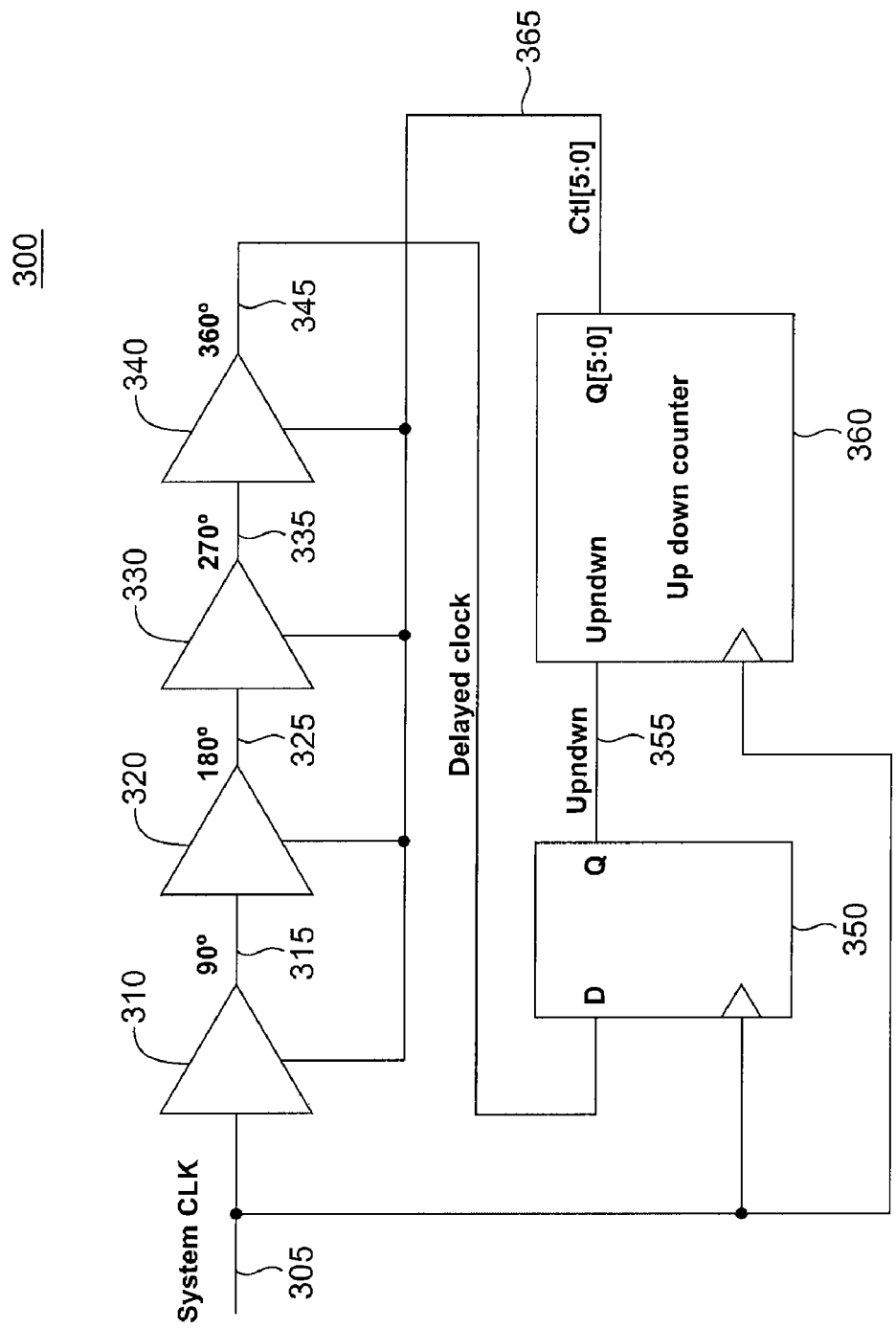
FIG. 3 is a block diagram of a control block consistent with an exemplary embodiment of the present invention.

FIG. 3 is a block diagram 300 showing an exemplary implementation for the control block 170 shown in FIG. 1. Included are four variable-delay buffers 310, 320, 330, and 340. In other embodiments, other numbers of variable-delay buffers may be used. For example, 8 buffers may be used. Also, each buffer may include other buffers or sub-buffers. Each of these variable-delay buffers contribute approximately 90 degrees of phase shift to the system clock applied on line 305. Each of these variable-delay buffers match the variable-delay buffer 120 in FIG. 1, or a similar delay buffer in other embodiments of the present invention.

Variable-delay buffer 340 provides an output to phase detector 350, where it is compared to the system clock on line 305. The outputs of the phase detector 350 drive the up/down counter 360, which is clocked by the system clock on line 305. The up/down counter provides an output bus Ct[5:0] 365 to the four variable-delay buffers in this figure and the variable-delay buffer 120 in FIG. 1. Phase detector 350 compares the phase of the delayed clock from the fourth variable-delay buffer against the phase of the system clock on line 305. The phase detector 350 determines whether a rising edge of the system clock precedes a rising edge of the delayed clock.

In a specific embodiment, this is done by a D-type flip-flop that determines the level of the delayed clock on line 345 at the rising edges of the system clock on line 305. If the level of the delayed clock is low, the rising edge of the system clock has come before the rising edge of the delayed clock, meaning the delayed clock has been excessively delayed. This results in a low for the up/down signal 355, which instructs the up/down counter 360 to count down by one so as to reduce the delay through the variable-delay buffers. Conversely, if the delayed clock signal on line 345 is high when the system clock on line 305 transitions high, the delayed clock has not been sufficiently delayed. The output of the phase detector 350 is high, which instructs the up/down counter 360 to count up by one, thus increasing the delay through the variable-delay buffers.

Again, in a specific embodiment, the level of the delayed clock on line 345 is determined at the time of the rising edges of the system clock on line 305. In other embodiments the rising edges of the delayed clock on line 345 may be compared to the rising edges of the system clock 305, for example, by using an RS flip-flop for the phase detector 350. Other methods of comparing the phase relationship of these two signals may be used.

Figure 4:
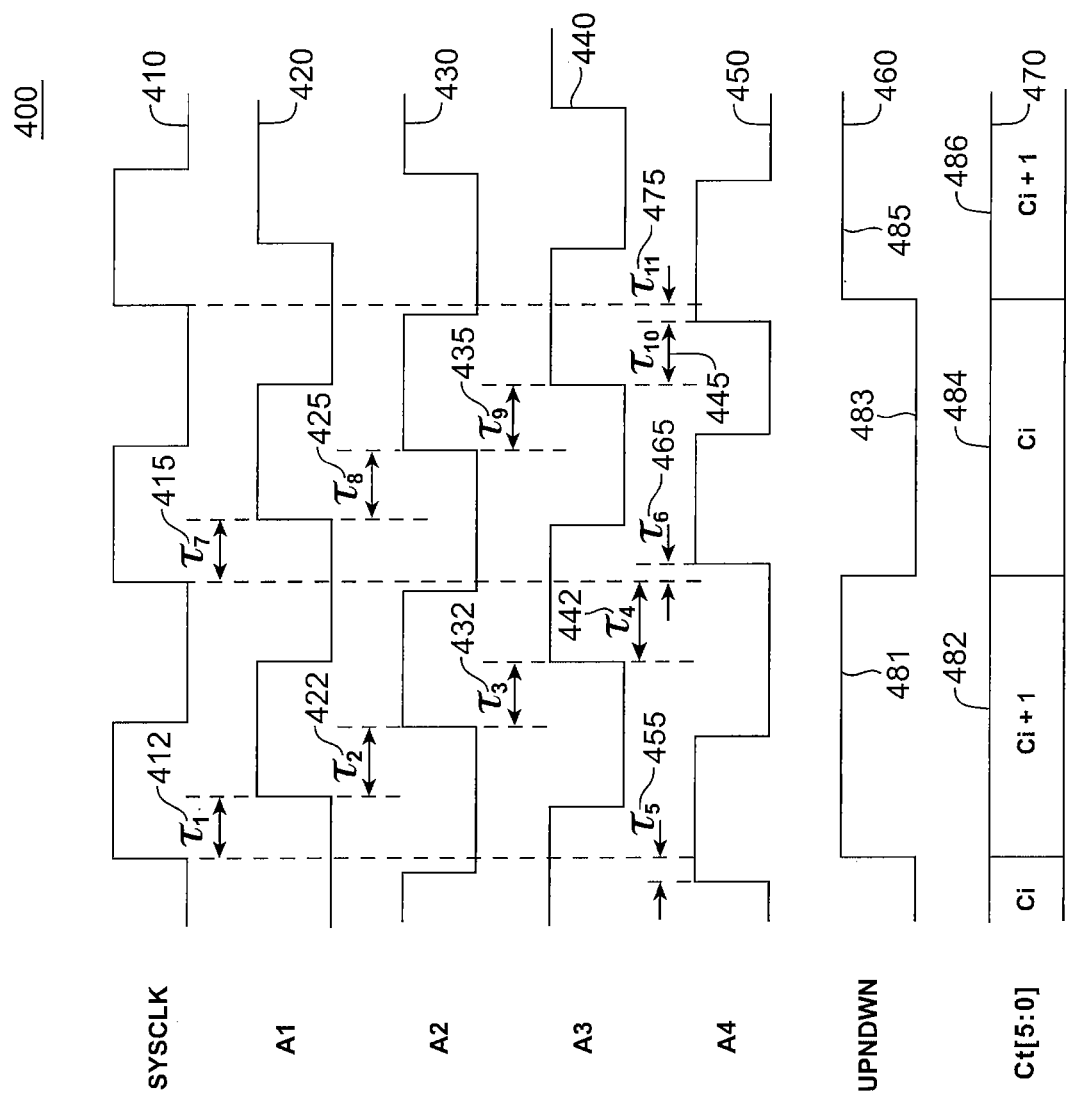
FIG. 4 is a timing diagram for the control block shown in FIG. 3.

FIG. 4 is a timing diagram 400 for the control block 300 shown in FIG. 3. A system clock 410 transitioning between a first level and a second level is received. The system clock 410 is delayed by variable-delay buffers (or elements or blocks) generating signals A1 420, A2 430, A3 440, and A4 450. The level of signal A4 is determined at each rising edge of system clock 410. For example, at time $t_5$ 455 the rising edge of A4 precedes the rising edge of the system clock 410 such that A4's level is high at the rising edge of system clock 410. This leads to a high level 481 for the up/down signal 460, which causes the up/down counter to increment from Ci to Ci+1 during time 482. The increase in count alters the variable delay through the variable-delay buffers that generate signals A1 through A4. This causes an increase in the delay times $t_1$ 412, $t_2$ 422, $t_3$ 432, and $t_4$ 442. As a result, in this example, the rising edge of A4 follows the rising edge of the system clock 410 at time $t_6$ 465. The up/down signal 460 is low at 483, which reduces the count of up/down counter 470 to $C_i$ during time 484. This reduction in count reduces the delay through the variable-delay buffers, such that delays $t_7$ 415, $t_8$ 425, $t_9$ 435, and $t_{10}$ 445 are decreased. Because of this, the rising edge of A4 450 precedes the rising edge of the system clock

410 at time $t_{11}$ 475. As before, this results in a high signal level for up/down 460, which increases the count of the up/down counter 470 to $C_{i+1}$ during time 486. As can be seen, during a locked state, the up/down counter often "ping-pongs" or alternates between two different states, shown here as $C_i$ and $C_{i+1}$.

Figure 5:
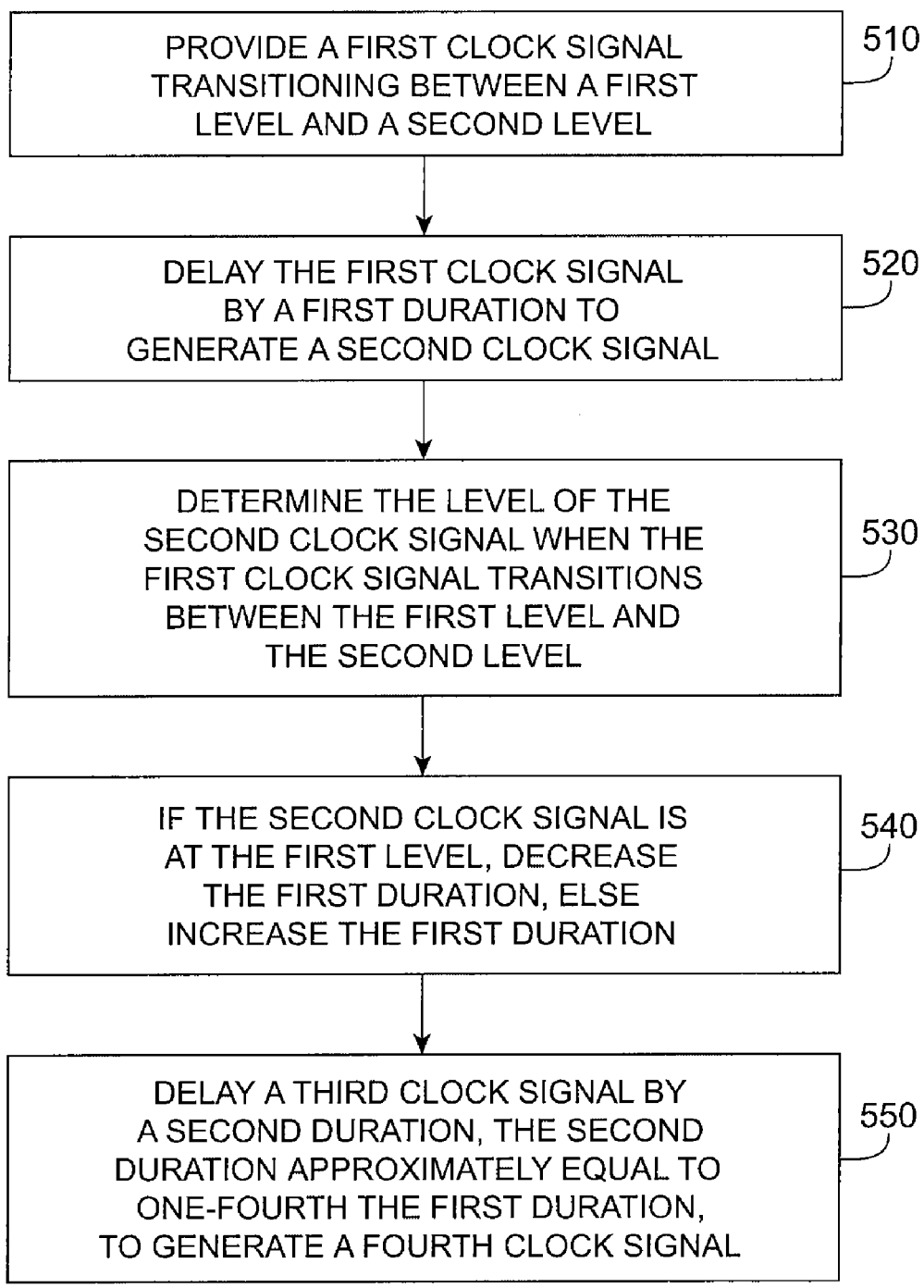
FIG. 5 is a flowchart of a method of the delaying a clock signal in accordance with embodiment of the present invention.

FIG. 5 is a flowchart 500 of a method of the delaying a clock signal in accordance with an embodiment of the present invention. In act 510, a first clock signal transitioning between a first level and a second level is received. The first clock signal is delayed by a first duration to generate a second clock signal in act 520. In act 530, the level of the second clock signal is determined at the time when the first clock signal transitions from the first level to the second level. If the second clock signal is at the first level, the first duration is decreased. If the second clock signal is at the second level, the first duration is increased in act 540. In act 550, a third clock signal is delayed by a second duration, the second duration approximately equal to one-fourth the first duration, to generate a fourth clock signal. In this way, the third clock signal is phase shifted by 90 degrees to generate a fourth clock signal.

There are at least two potential difficulties that should be considered when implementing the circuit of FIG. 3. First, when the up/down counter increments or decrements to change the delay through the variable-delay buffers, only the duration of one clock cycle is available for the variable-delay buffers to settle. For example, in FIG. 4, as the Ct[5:0] signal 470 changes in value, for example, between times 482 and 484, only one clock cycle passes before a new decision regarding whether to increment or decrement the counter must be made at time $t_{11}$ 475. Second, if the delay of the variable-delay buffers is significantly incorrect, the loop may not be able to adjust properly. This may be particularly true in designs where the input-frequency capture range is large to accommodate the tolerances for various integrated circuit components.

Figure 6:
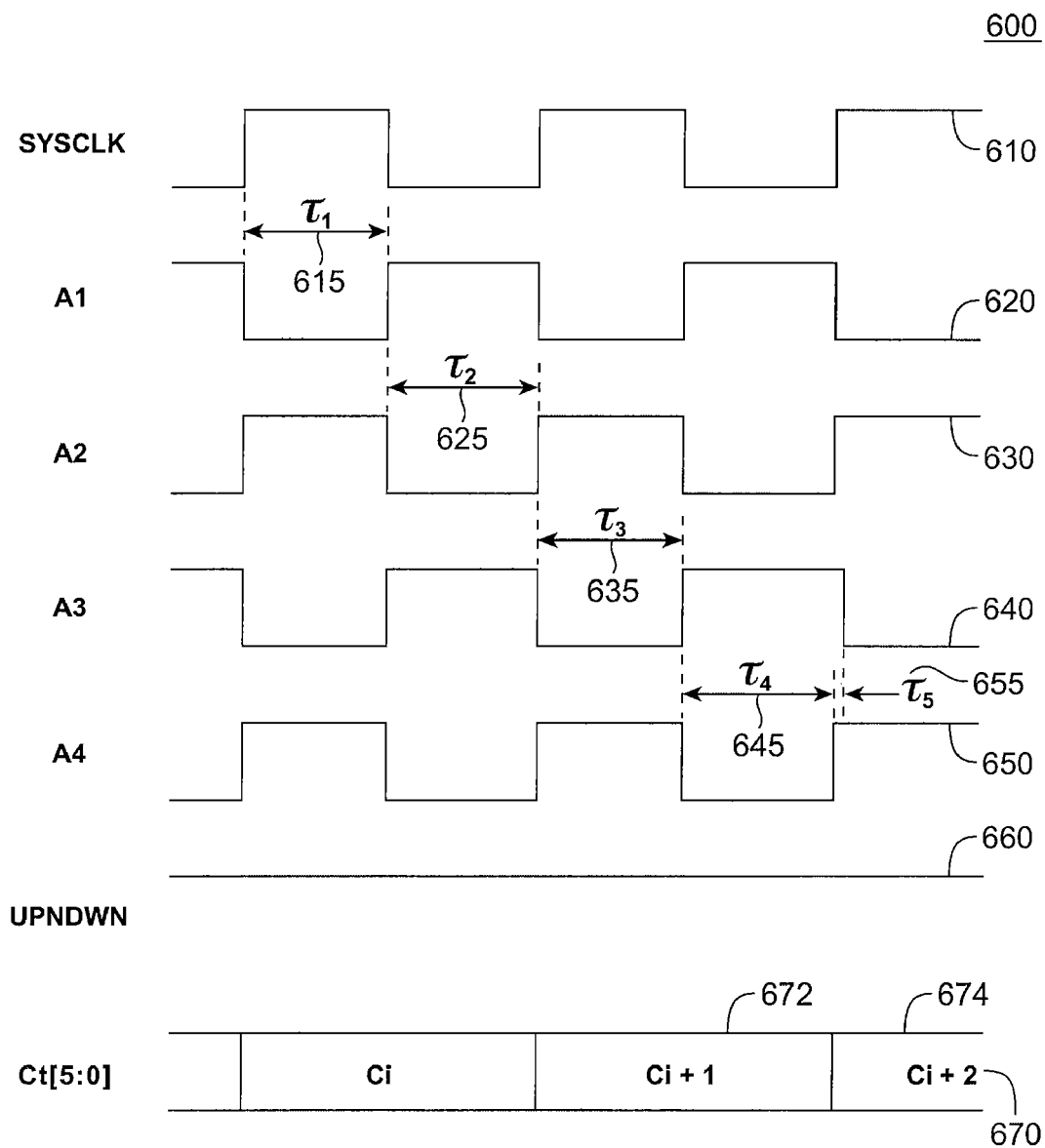
FIG. 6 is a timing diagram showing the operation of the control block in FIG. 3 when the delay is through the variable-delay buffers are excessive.

FIG. 6 is a timing diagram 600 showing the operation of the control block 300 in FIG. 3 when the delays through the variable-delay buffers are excessive. Specifically, the SYSCLK 610 is delayed by a duration $t_1$ 615, resulting in signal A1 620, which is again delayed by a duration $t_2$ 625, resulting in signal A2 630. This signal is again delayed, this time by a time $t_3$ 635, resulting in signal A3 640, which is again delayed by a duration $t_4$ 645, resulting in signal A4 650. In a specific embodiment, the delays $t_1$ through $t_4$ are approximately equal.

As can be seen in this example, an edge of SYSCLK 610 is delayed approximately two clock cycles through the variable-delay buffers. But since the rising edge of A4 650 precedes a rising edge of SYSCLK 610 at time $t_5$ 655, the up/down signal 660 is high, and the up/down counter output 670 increments by one from time 672 to time 674. This has the effect of further increasing the delays $t_1$ through $t_4$ until each delay is approximately 180 degrees or one-half a clock cycle resulting in the total delay of 2 clock cycles. Because of this, the loop is not able to recover and shorten the cumulative delay through the variable-delay buffers to one clock cycle. This also happens if the delays $t_1$ through $t_4$ are other multiples of 90 degrees, such as 270 or 360 degrees, when the total delay through the variable-delay buffers is three and four clock cycles.

Figure 7:
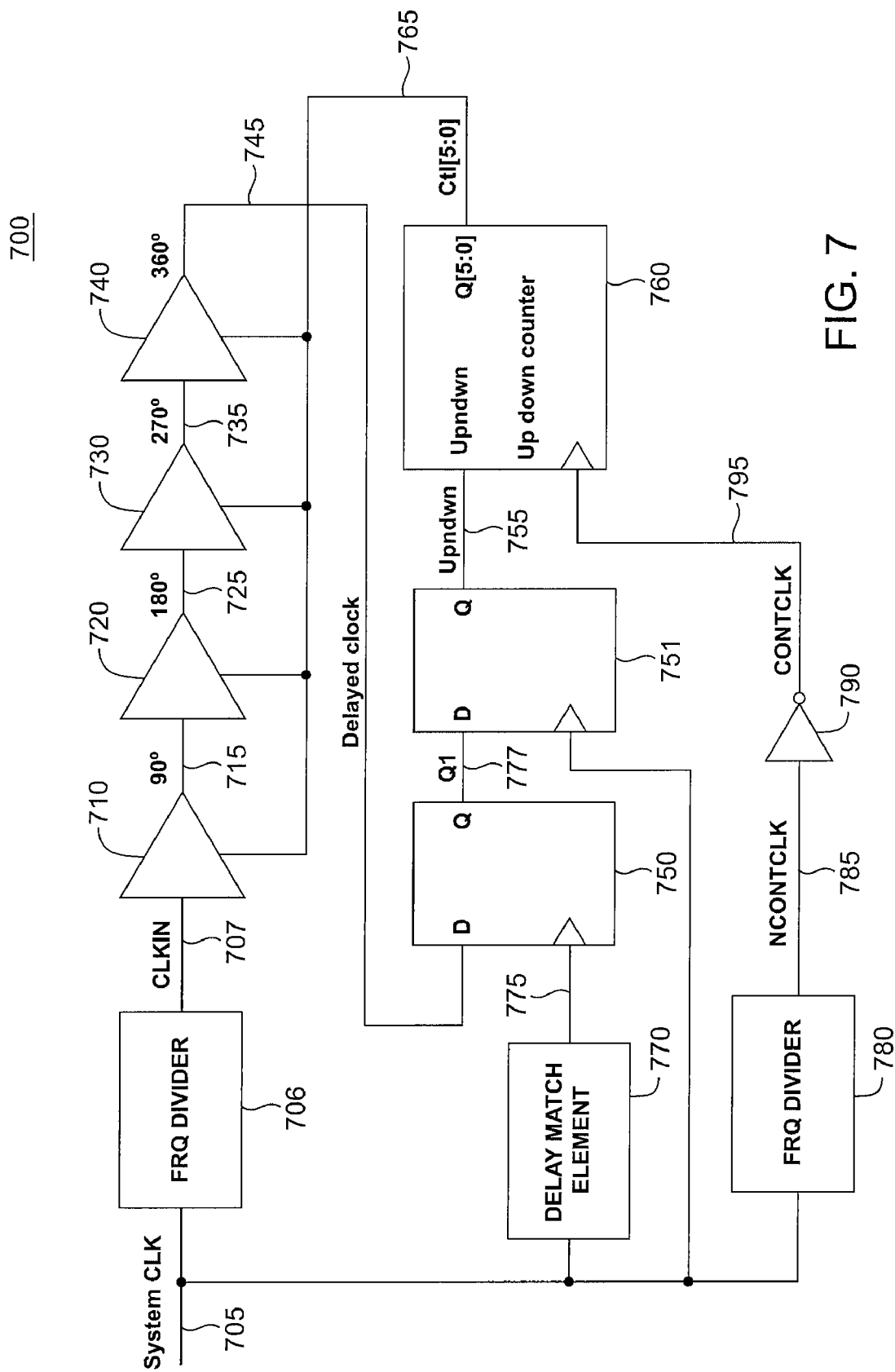
FIG. 7 is a block diagram of a control block consistent with an embodiment of the present invention.

FIG. 7 is a block diagram 700 of an alternative implementation for a control block consistent with another exemplary embodiment of the present invention. This block can be used for control block 170 in FIG. 1, or other embodiments of the present invention. Circuitry that mitigates both the above obstacles is included. Shown are frequency dividers 706 and 780, variable-delay buffers 710, 720, 730, and 740, phase detector 750, flip-flop 751, up/down counter 760, and inverter 790. The up/down counter may be a binarily-weighted, thermal, or other type of up/down counter, such as a combination binarily-weighted and thermal counter. In a specific embodiment, the counter is binarily weighted.

A system clock signal on line 705 is received by frequency divider 706. Frequency divider 706 divides the system clock signal's frequency, thereby generating the CLKIN signal on line 707. In a specific embodiment, frequency divider 706 divides the system clock frequency by 8. Alternately, other frequency divisions are possible, such a divide by 4, 16, or other value. The lower frequency CLKIN signal on line 707 is delayed by variable-delay buffers 710, 720, 730, and 740. A delayed clock signal on line 745 is provided to phase detector 750. Delay match element 770 is designed to match the delay in the frequency divider 706, and provide an output signal on line 775 to the phase detector 750. The phase detector 750 determines the phase relationship between the system clock and the delayed clock, for example, whether a rising edge of the system clock precedes a rising edge of the delayed clock. Alternately, the phase detector may determine whether a falling edge of the system clock precedes a falling edge of the delayed clock.

In a specific embodiment, phase detector 750 does this by determining the level of the delayed clock signal on line 745 at the rising edges of the clock signal on line 775. This level detection results in output signal Q1 on line 777, which is input to flip-flop 751. Flip-flop 751 is clocked by the system clock on line 705 and provides the up/down signal 755 to the up/down counter 760. A second frequency divider 780 divides the system clock's frequency, thus generating signal NCONTCLK on line 785. Again, in a specific embodiment of the present invention, frequency divider 780 divides the system clock frequency by eight. In other embodiments, this divisor may be different, such as 4, 16, or other appropriate value. The NCONTCLK signal on line 785 is inverted by inverter 790, resulting in a CONTCLK signal on line 795. The CONTCLK signal on line 795 clocks the up/down signal on line 755 into the up/down counter, resulting in the output signal Ct[5:0] on bus 765.

Again, when the output of up/down counter 760 changes, the delays through the variable-delay buffers 710 through 740 change. But this change in delay is not instantaneous, and takes a finite duration to reach a final value. In a specific embodiment, frequency dividers 706 and 780 are separate frequency dividers such that their output edges may be timed to give the variable-delay buffers 710 through 740 a maximum duration in which to settle. In other embodiments, frequency dividers 706 and 780 may be the same frequency divider.

Again, the delay match element 770 is designed to match the delay between a system clock rising edge and a CLKIN rising edge on lines 705 and 707. Matching these delays enables the phase detector 750 to adjust the delay of the variable-delay buffers 710 through 740 with a minimum amount of systematic delay errors.

The variable-delay buffers 710 through 740 match or are similar to the variable-delay buffer 120 in FIG. 1. The cumulative delay provided by variable-delay buffers 710-740 is one clock cycle or 360 degrees. In a double-data-rate interface the delay of the variable-delay buffer 120 in FIG. 1 is one-fourth the cumulative delay of the variable-delay buffers 710 through 740, or one-quarter of a clock cycle or 90 degrees. In other multiple-data-rate interfaces the phase shift may be different, and there may be more variable-delay buffers like 120 in FIG. 1 providing different delays. For example, delays of 60 and 120, or 45, 90, and 135 degrees may be provided by multiple variable-delay buffers connected in series or parallel. These delays can be used in triple and quadruple-data-rate interfaces, respectively. Alternately, they may be used in other data-rate interfaces.

In other embodiments, the system clock and DQS signal may be harmonics or have frequencies that are multiple of each other. For example, the DQS signal may be the second harmonic, or have twice the frequency of the system clock. In that case, a delay of one system clock cycle in the divided system clock signal CLKIN corresponds to a two cycle delay in the DQS signal. Accordingly, eight elements may be used in the system clock delay path, while one matching element is used in the DQS path.

One skilled in the relevant art appreciates that this block diagram may be drawn differently without deviating from the scope of the present invention. For example, the phase detector 750 and flip-flop 751 may be considered as a single phase detector block. Also, the flip-flop 751 may be considered as a block inside the up/down counter 760. Further, the variable-delay buffers 710 through 740 may be in front of the frequency divider 706, or some of the variable-delay buffers 710 through 740 may be in front of the frequency divider 706, while the remainder follow it.

Figure 8:
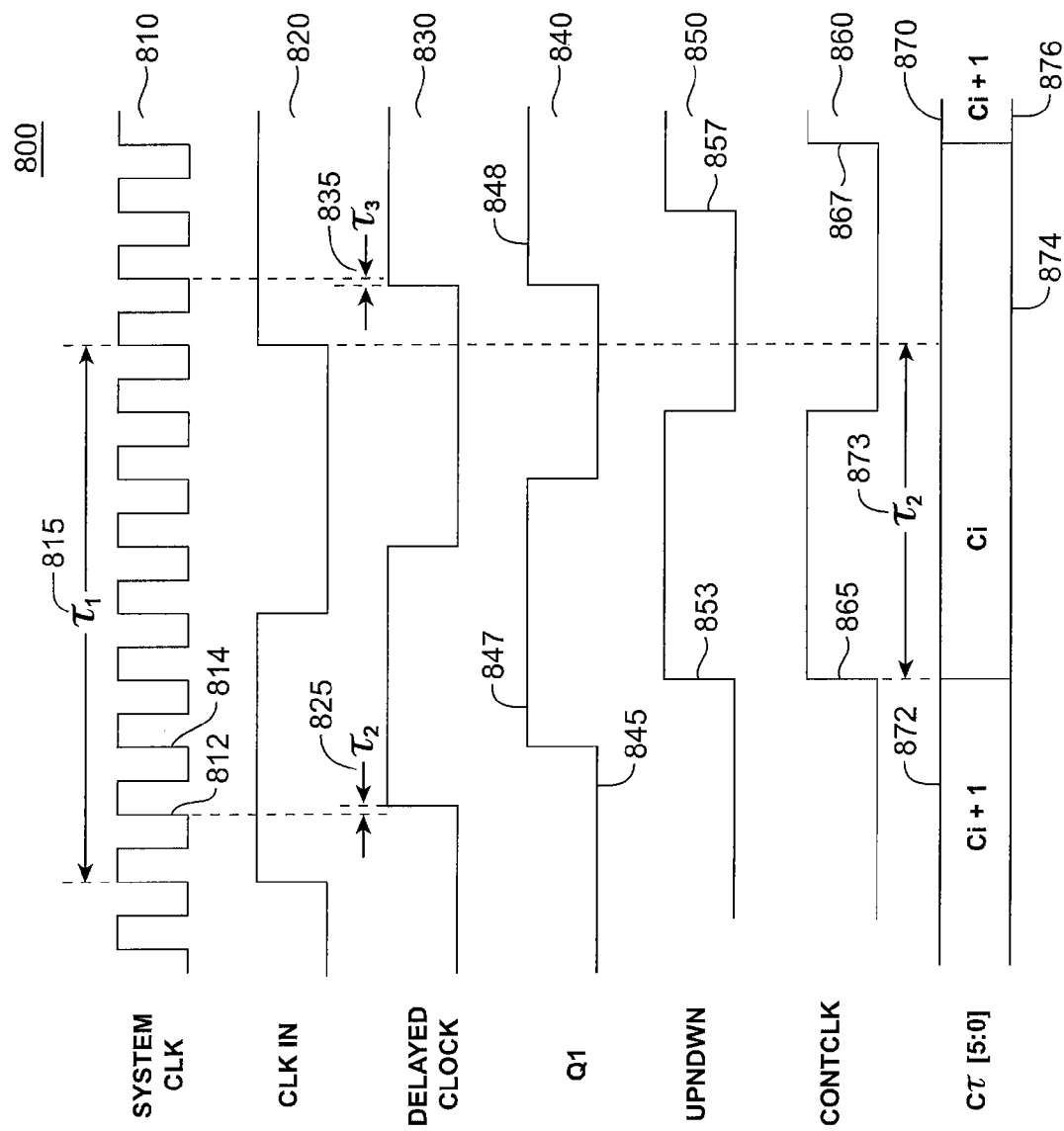
FIG. 8 is a timing diagram for the control block of FIG. 7.

FIG. 8 is a timing diagram 800 for the control block of FIG. 7. A system clock signal 810 is provided, transitioning between a first level and a second level. The frequency of the system clock signal 810 is divided by eight to produce CLKIN 820. That is, eight system clock cycles corresponding to $t_1$ 815 resulting in one cycle of CLKIN 820. In other embodiments, it may be divided by 4, 16, or other value. CLKIN 820 is delayed, thus generating the delayed clock signal 830. For simplicity, the gate delays through the frequency divider and match delay elements are shown to be zero.

At each rising edge of the system clock 810, the level of the delayed clock 830 determines the level of Q1 840. For example, at time $t_2$ 825, the rising edge of the delayed clock signal 830 follows—occurs after—the rising edge of the system clock signal 810. Thus, the level of the delayed clock signal 830 is low at the corresponding rising edge 812 of the system clock 810. Accordingly, the level of Q1 840 remains low at time 845. At the next system clock rising edge 814, the level of the delayed clock signal 830 is high, and Q1 840 is high at time 847.

The updwn signal 850 is the signal Q1 840 retimed to the system clock, and follows Q1 840 by approximately one clock cycle less the delay through the matched delay element. The rising edge 865 of contclk signal 860 is aligned to store the resulting value of updwn 850, in this example a low. This low causes the count Ct[5:0] to be decremented by one, from $C_{i+1}$ to $C_i$ from time 872 to 874. The updwn signal 850 may be delayed by a setup time to ensure proper clocking by the contclk signal 860.

In this specific example, a decrease in the count causes the delay from a rising edge of CLKIN 820 to a rising edge of the delayed clock 830 to decrease. Accordingly, at time $t_3$ 835, the rising edge of the delayed clock 830 precedes the rising edge of the system clock 810, such that Q1 is high at time 848. Accordingly, updwn 850 is high at the rising edge 857 of contclk 860, and the count increases at time 876 to $C_{i+1}$. This increases the delay of the next rising edge of the delayed clock signal 830, and the above process repeats itself.

In this example, the loop can be said to be locked, and the count alternates between two values following each rising edge of CLKIN 820. At other times, for example power up, the count may continuously increase or decrease for several cycles of CLKIN 820 until this locked state is reached.

In a specific embodiment, the contclk signal is generated by a separate frequency divider than the one used to divide the system clock 810 to generate CLKIN 820. This allows the loop to be designed such that the variable-delay buffers have the maximum time in which to settle following a change in the up/down counter output. In this example, the time $t_6$ 865 is available for settling after a change in the count until the next CLKIN rising edge.

Figure 9:
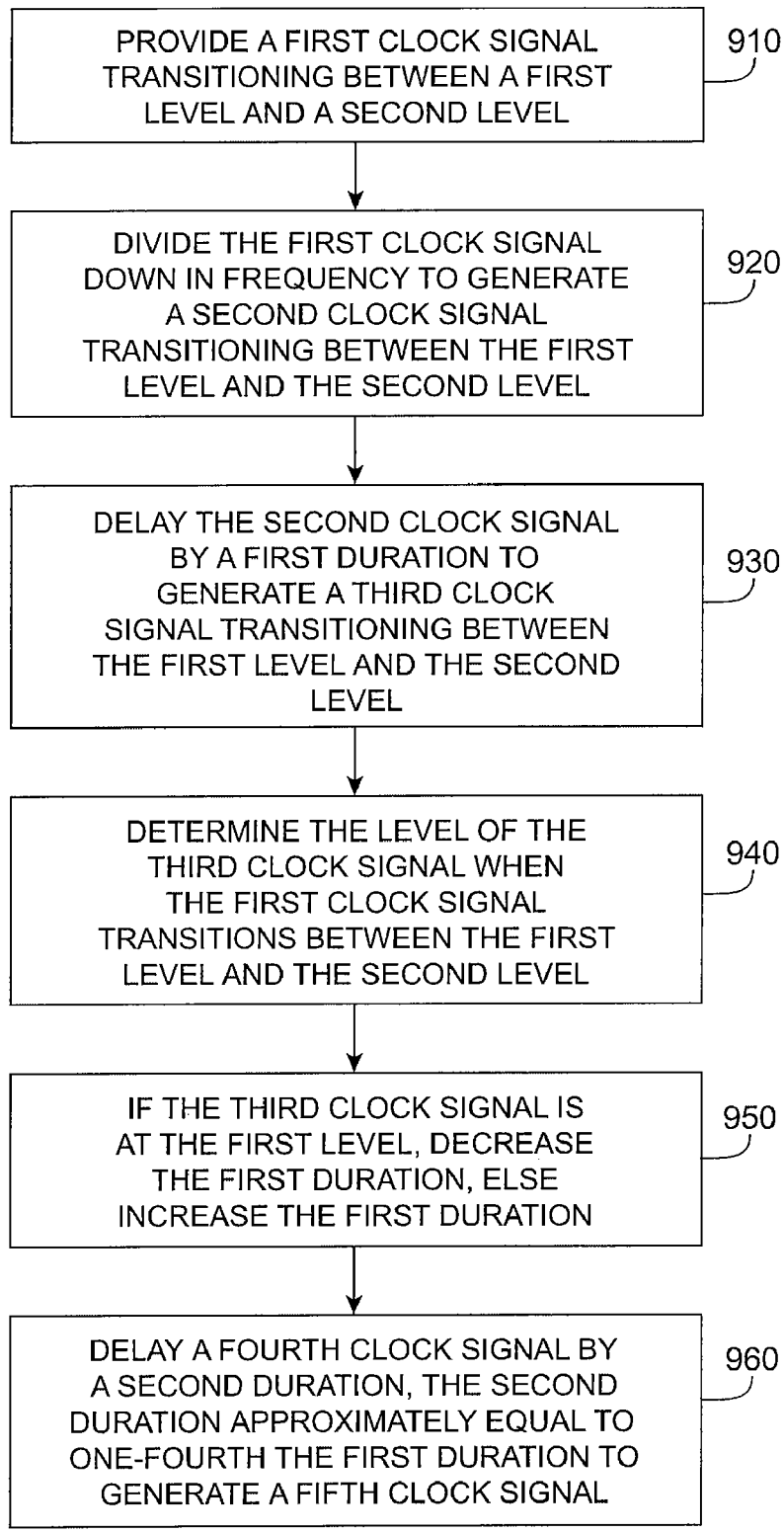
FIG. 9 is a flowchart illustrating a method of delaying a clock signal in accordance with embodiment of the present invention.

FIG. 9 is a flowchart 900 illustrating a method of delaying a clock signal in a multiple-data-rate interface. In act 910, a first clock signal transitioning between a first level and a second level is received. The first clock signal's frequency is divided in act 920 to generate a second clock signal. The second clock signal is delayed by a first duration to generate a third clock signal in act 930. In act 940, the level of the third clock signal is determined at the time the first clock signal transitions from the first level to the second level. If the third clock signal is at the first level, the first duration is decreased. If the third clock signal is at the second level, the first duration is increased in act 950. A fourth clock signal is delayed by a second duration, the second duration approximately equal to one-fourth the first duration, to generate a fifth clock signal in act 960. In this way, the fifth clock signal is delayed by approximately 90 degrees relative to the fourth clock signal.

Figure 10:
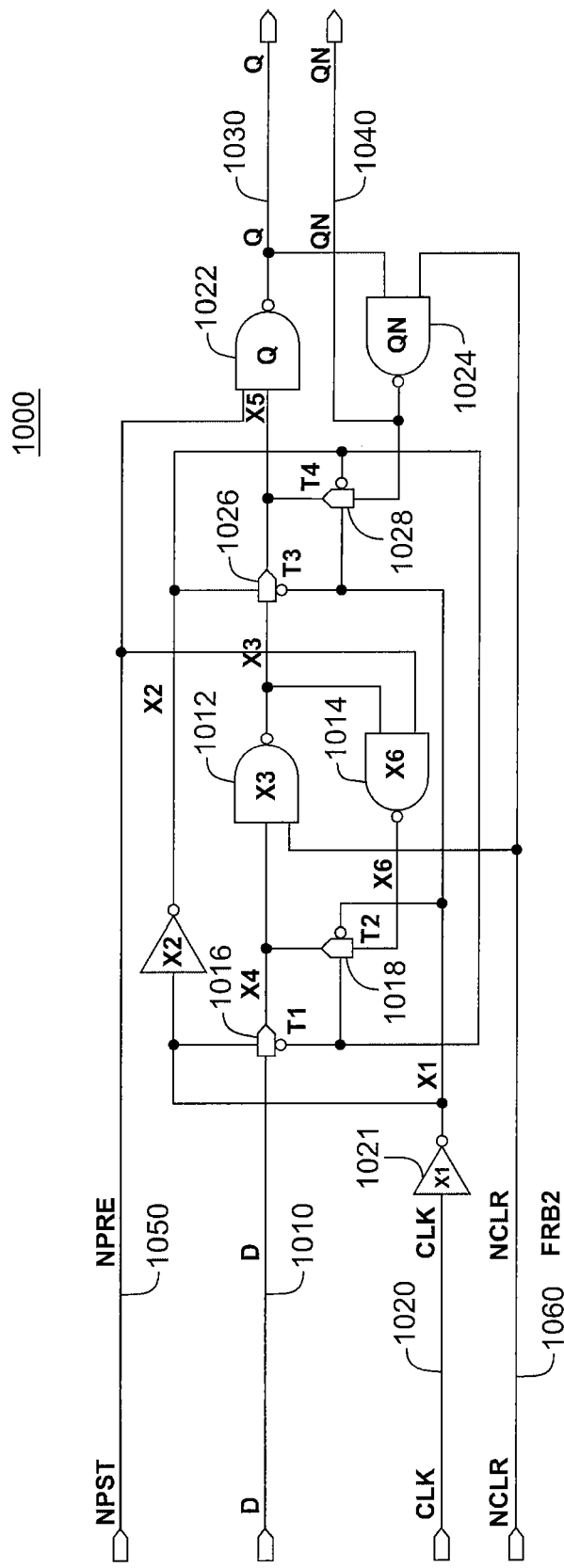
FIG. 10 is a schematic of a flip-flop that may be used as the phase detector in FIG. 7.

FIG. 10 is a schematic 1000 of an exemplary flip-flop that may be used as the phase detector 750 or flip-flop 751 in FIG. 7. This flip-flop may also be used as a part of the frequency dividers 706 or 780, or up/down counter 760, also in FIG. 7. In other embodiments, other flip-flops may be used for these circuits. Input signals include D on line 110, CLK on line 1020, NCLR on line 1060, and NPRE on line 1050. Output signals Q and QN are provided on lines 1030 and 1040. This flip-flop includes two latches, each formed by two AND gates. Gates 1012 and 1014 form a first latch, while gates 1022 and 1024 form the second. Each latch alternates between operating in the pass and latch modes. While one latch is in the pass mode, the other is in the latch mode.

When the first latch is in the pass mode and the second latch is latched, the flip-flop stores data at the D input. In this mode, the feedback path provided by AND gate 1014 is opened by pass gate 1018, and data is passed through pass gate 1016. Also, pass gate 1026 is open, while feedback pass gate 1028 is closed.

When the first latch is latched and the second latch is in the pass mode, the flip-flop outputs a data bit at the Q and QN outputs. In this mode, pass gate 1016 is open, and the feedback path provided by AND gate 1014 is closed by pass gate 1018, allowing data to be retained in the first latch. Also, pass gate 1026 is closed, allowing data from the first latch to be output, while feedback path pass gate 1028 is open.

Figure 11:
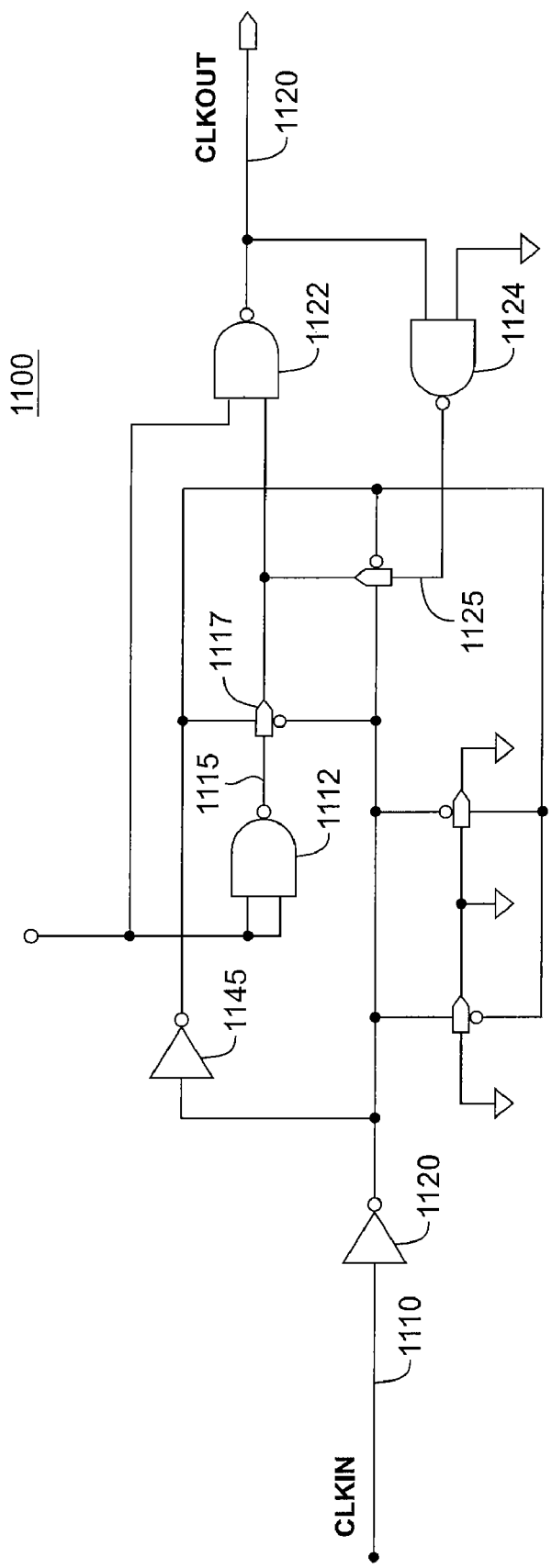
FIG. 11 is a schematic of the delay matching element in FIG. 7.

FIG. 11 is a schematic 1100 showing an exemplary implementation for the match delay element 770 in FIG. 7. The circuit is designed such that the delay from CLKIN on line 1110 to CLKOUT on 1120 matches the clock-to-Q delay of the flip-flop in FIG. 10. The clock-to-Q delay of the flip-flop of FIG. 10 is as follows: a rising edge of the clock signal on line 1020 is inverted by inverter 1021 which turns on pass gate 1026, and shuts off pass gate 1028. The data at the input of pass gate 1026 drives AND gate 1022, resulting in output signal Q on line 1030. Thus, the clock-to-Q delay for the flip-flop of FIG. 10 is approximately equal to the cumulative delays through an inverter, pass gate, and AND gate.

Similarly, the delay through the delay element of FIG. 11 is as follows: CLKIN on line 1110 is inverted by inverter 1120, which turns on pass gate 1117, thus driving AND gate 1122, resulting in a change in the CLKOUT signal on line 1120. Thus, the delay through the delay element is approximately equal to the delay of an inverter, a pass gate, and an AND gate. Accordingly, the delay through this circuit should approximately match the clock-to-Q delay of the flip-flop in FIG. 10.

Figure 12:
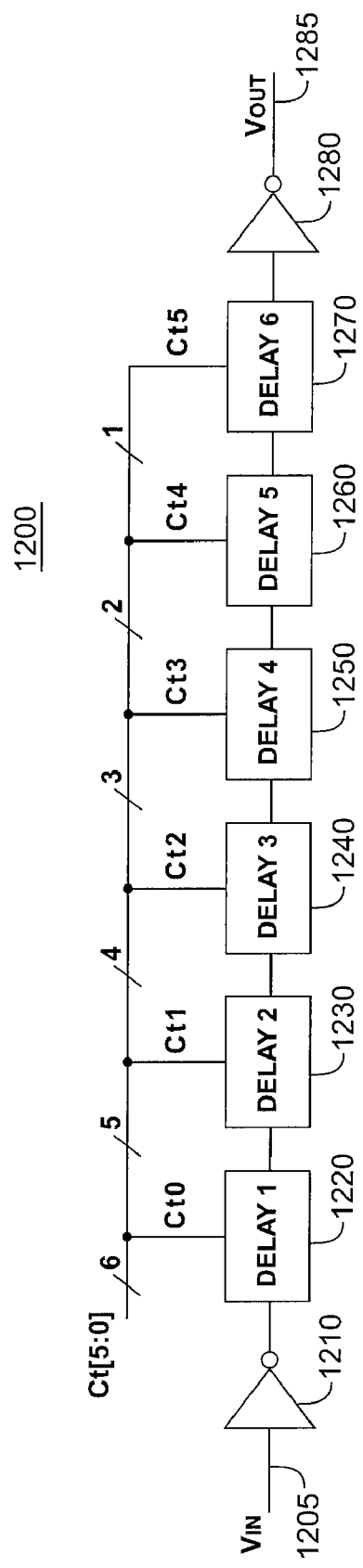
FIG. 12 is a block diagram a variable-delay buffer.

FIG. 12 is a block diagram 1200 showing an exemplary embodiment for a variable-delay buffer, such as buffer 120 in FIG. 1, buffers 310 through 340 in FIG. 3, and buffers 710 through 740 in FIG. 7. Included are inverters 1210 and 1280, and delay elements 1220, 1230, 1240, 1250, 1260, and 1270. Input signal VIN is received on line 1205 by inverter 1210. This inverter squares up (gains up) the input signal and drives delay element DELAY1 1220. The delay through DELAY1 1220 is under control of the LSB Ct0 from the up/down counter. That is, the delay through DELAY1 is adjusted by changing the state of Ct0. DELAY1 1220 in turn drives delay element DELAY2 1230. The delay through DELAY2 1230 is under the control of bit Ct1. DELAY2 1230 in turn drives delay element DELAY3 1240, which is under the control of bit Ct2. DELAY3 1240 in turn drives delay element DELAY4 1250. The delay through the DELAY4 1250 is under the control of bit Ct3. DELAY4 1250 in turn drives delay element DELAY5 1260, which is under the control of bit Ct4. DELAY5 1260 in turn drives delay element DELAY6 1270, controlled by bit Ct4. Delay element DELAY6 1270 drives inverter 1280, which squares up the signal at its input and generates output signal VOUT on line 1285. The delay through DELAY6 1270 is under the control of the MSB bit Ct5.

One skilled in the relevant art would appreciate that other configurations can be used without varying from the scope or spirit of the present invention. For example, a different number of delay elements may be used. For example, one delay element may be used. Alternately, 2, 4, or other appropriate number may be used. Also, the number of inverters may vary. For example, no inverters may be used, or each delay element may be buffered with an inverter.

Figure 13:
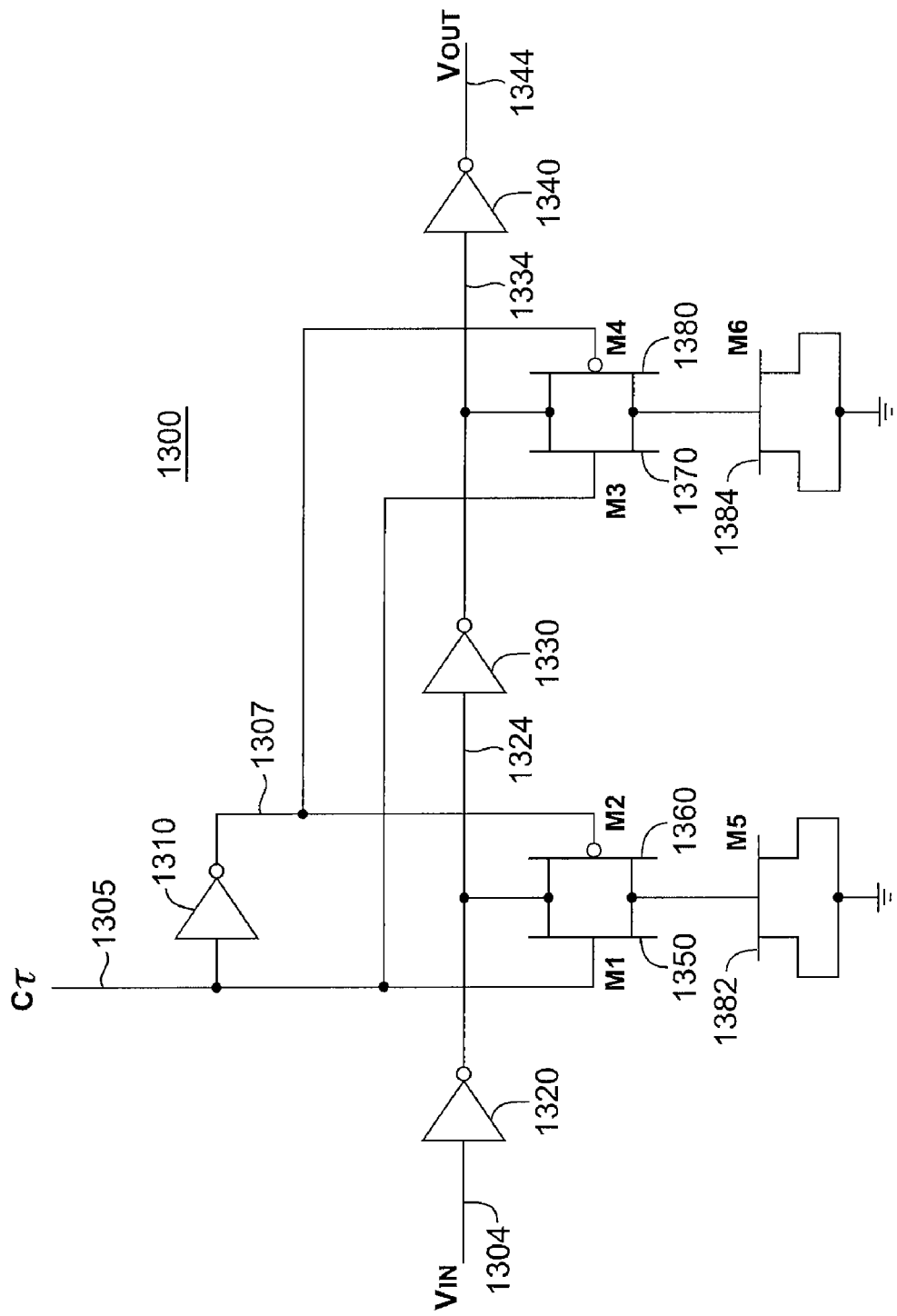
FIG. 13 is a schematic of a delay element.

FIG. 13 is a schematic 1300 showing an exemplary delay element, such as the delay elements 1230 through 1270 in FIG. 12. In a specific embodiment, FIG. 13 is the schematic for DELAY1 1220, DELAY2 1230, DELAY3 1240, and DELAY4 1250. Included are signal path inverters 1220, 1230, and 1240, control inverter 1310, and pass gates formed by devices M1 1350 and M2 1360, and M3 1370 and M4 1380, and MOS capacitors M5 1382 and M6 1384.

When the signal Ct0 on line 1305 is high, the output of inverter 1310 on line 1307 is low. Accordingly, the pass gates formed by M1 1350 and M2 1360, and M3 1370 and M4 1380, are in their pass modes, and capacitors M5 1382 and M6 1384 are connected to the output of inverters 1320 and 1330. In this case, when Vin on line 1304 transitions, the output of inverter 1320 drives the capacitor formed by the gate of M5 1382. This slows the resulting edge of the signal on line 1324, thus delaying the signal to the inverter 1330. Likewise, the output of inverter 1330 drives the capacitor formed by the gate of device M6 1384, thus slowing the transition of the signal on line 1334 and delaying Vout on line 1344.

Conversely, if the signal CT0 on line 1305 is low, the signal on line 1305 is high. In this case, the pass gates formed by M1 1350 and M2 1360, and M3 1370 and M4 1380 are open. Accordingly, the inverters 1320 and 1330 do not drive the capacitors formed by the gates of M5 1382 and M6 1384. As a result, the signal Vout is not delayed by the capacitors.

Inverter 1340 squares up the output signal Vout, such that the next stage sees similar rising and falling edges regardless of the state of the Ct signal. This avoids the change in the delay through the next stage that would otherwise occur as the rise and fall times varied as Ct changed. This isolation between delay elements helps ensure a predicable change in delay for a changing count from the up/down counter.

Figure 14:
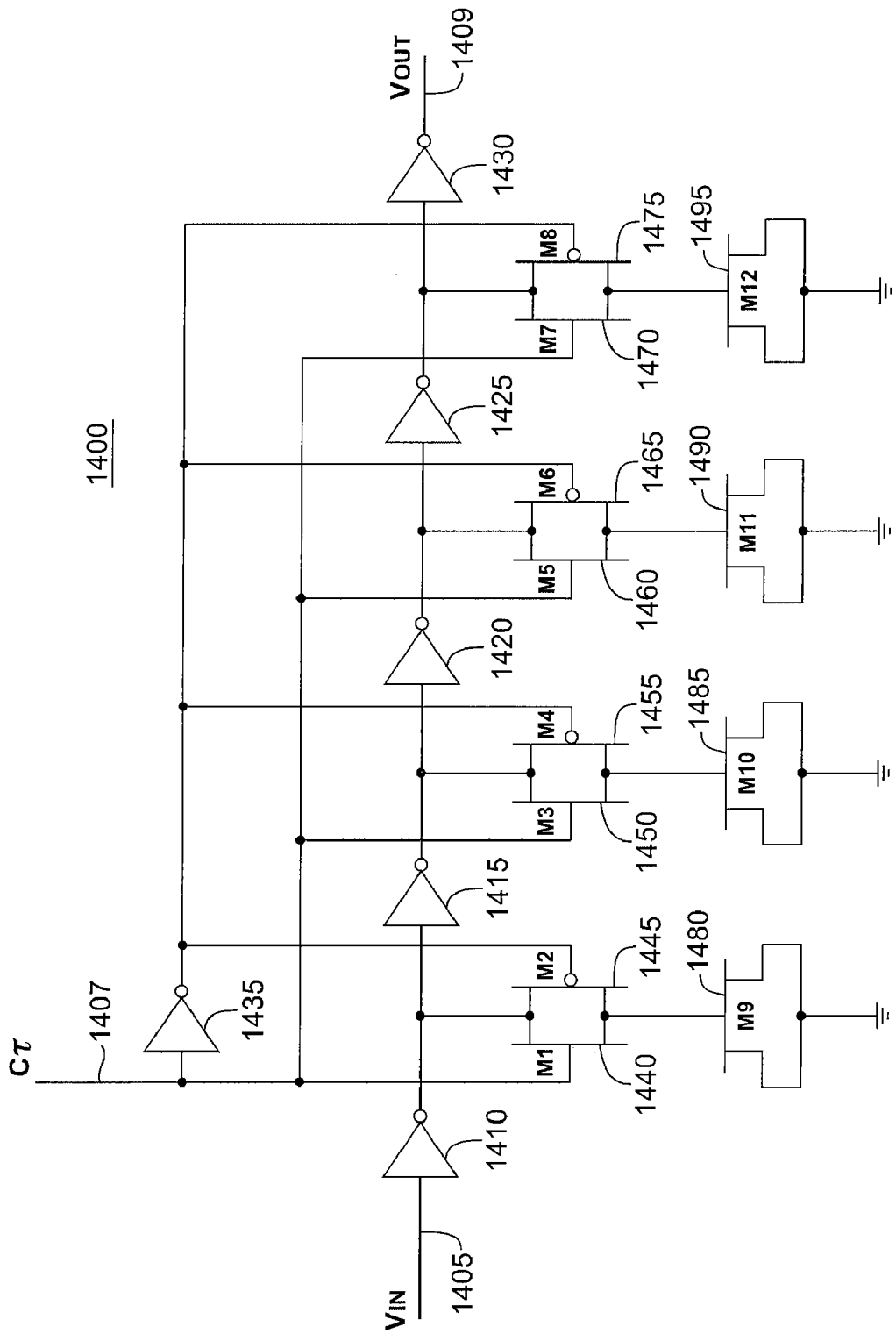
FIG. 14 is a schematic of another delay element.

FIG. 14 is a schematic 1400 of another exemplary delay element, such as the delay elements 1230 through 1270 in FIG. 12. In a specific embodiment, FIG. 14 is the schematic for DELAY5 1260. Included are signal path inverters 1410, 1415, 1420, 1425, and 1430, control inverter 1435, and pass gates formed by devices M1 1440 and M2 1445, M3 1450 and M4 1455, M5 1460 and M6 1465, and M7 1470 and M8 1475, and MOS capacitors M9 1480, M10 1485, M11 1490, and M12 1495.

When the Ct signal on line 1407 is high, the output of inverter 1435 is low. Accordingly, the pass gates are in their pass modes, and the capacitors are connected to the output of inverters 1410 through 1425. In this case, when Vin on line 1405 transitions or changes state, the output of inverter 1410 drives the capacitor formed by the gate of M9 1480. This slows the edge of the resulting signal, thus delaying the signals arrival at inverter 1415. Likewise, the output of inverter 1415 drives the capacitor formed by the gate of device M10 1485, thereby slowing the output signal. In a similar fashion, the outputs of inverters 1420 and 1425 are delayed, thereby delaying the signal Vout on line 1409.

If the signal Ct0 on line 1407 is low, its output signal is high. In this case, the pass gates are open. Accordingly, the inverters 1410 through 1425 do not drive the capacitors formed by the gates of devices M9 through M12. As a result, the signal Vout is not delayed by the capacitors.

Again, inverter 1430 squares up the output signal Vout on line 1409 such that the next stage sees similar rising and falling edges independent of the state of the Ct signal. This avoids the change in the delay through the next stage that would otherwise occur as the rise and fall times varied as Ct changed. This isolation between delay elements helps ensure a predicable change in delay for a changing count from the up/down counter.

In a specific embodiment, delay element DELAY6 1270 includes a series of nine inverters, with pass gates at the outputs of the first eight, the pass gates connecting or disconnecting capacitors from the inverter outputs, under control of a Ct bit and inverter.

In this specific embodiment, the up/down counter is binarily weighted. Accordingly, the variability of the delay through the variable-delay buffers is binarily weighted. As a first approximation, the capacitors in DELAY1 1220 through DELAY4 1250 are successively twice the size of the last delay element. The capacitors in DELAY 6 1270 and DELAY5 1260 are the same as in DELAY4 1250, since there are twice as many of them in each successive element. But this is not expected to be exact, since not all the delay is due to capacitors; part of the delay is the inherent delay through the inverters themselves. Moreover, there are parasitic and loading capacitances to account for.

The pass gates further complicate matters, since they have a parasitic resistance that de-Qs the capacitors, which effectively changes their size. To some extent, it is desirable to increase their size in proportion to the capacitor value. But there are two drawbacks to this. First, the sizes of the devices can become somewhat unwieldy. Second, the parasitics of the source/drain connections at the output of the inverters act as a load even when the pass gates are open. Thus, larger devices decrease the variability of the variable-delay buffers between their states.

In this specific embodiment, the signal path inverters themselves are the same size. In other embodiments, the inverters may be similarly scaled. Typically the control bit inverters can all be the same size.

Figure 15:
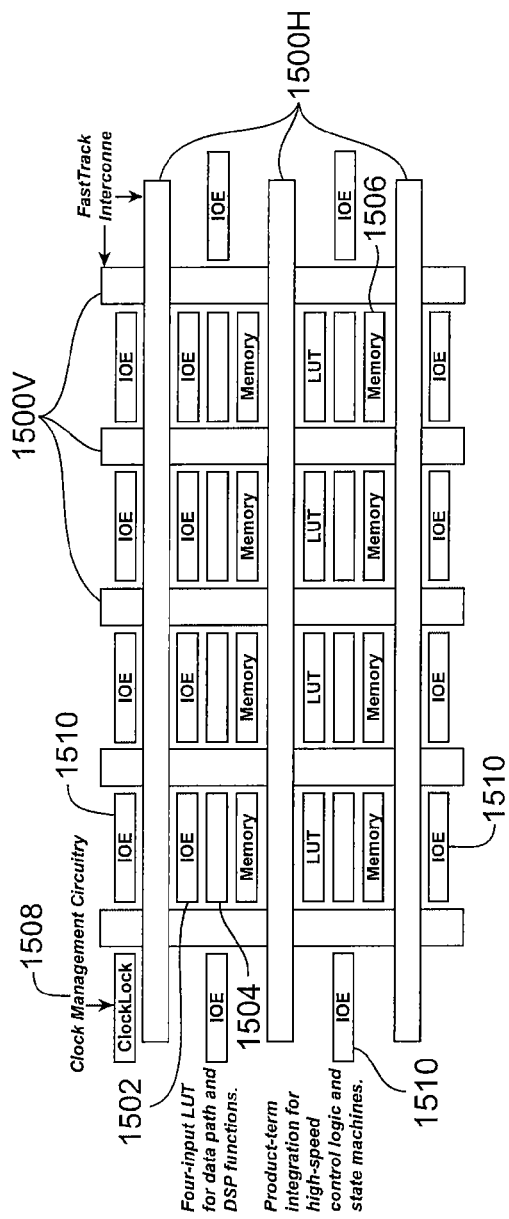
FIG. 15 shows one example of PLD core logic architecture.

FIG. 15 shows a simplified example of a PLD core logic architecture. The PLD according to this example includes a network of fast track interconnect lines 1500H and 1500V that provide programmable interconnection between logic and memory resources that are arranged in blocks defined by the interconnect lines. These blocks may include look-up table (LUT) logic 1502 for data path and digital signal processing functions, product term logic 1504 for high-speed control logic and state machines, as well as memory 1506. Other peripheral circuitry such as clock management circuit and I/O drivers 1510 may also be included. A more detailed description of a PLD of the type shown in FIG. 15 can be found in data books published by Altera Corporation, and in particular the APEX II PLD family, which is hereby incorporated by reference. It is to be understood, however, that the invention is not limited to a particular type of PLD architecture and that the self-compensating delay chain for a multiple-data-rate I/O architecture according to the present invention can be utilized in any type of programmable logic device, many variations of which are described in Altera Corporation data books.

Figure 16:
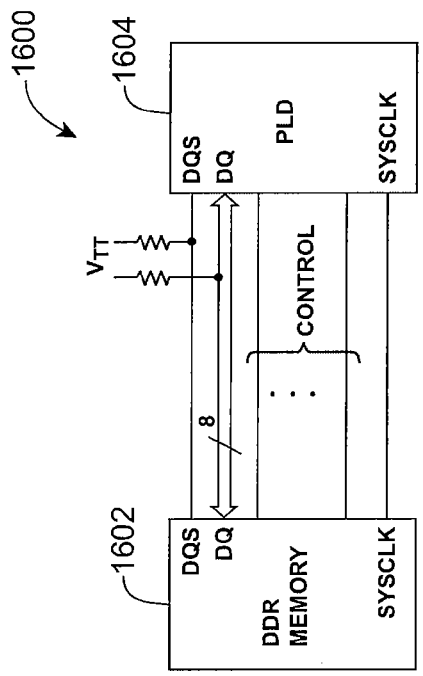
FIG. 16 illustrates a block diagram of a computing system.

FIG. 16 is a block diagram of a computing system 1600 that includes a multiple-data rate memory device 1602 connected to a PLD 1604 according to the present invention. In this example, memory device 1602 may be a DDR SDRAM device that bundles, e.g., eight DQ data lines with each DQS strobe line. The interconnect between memory device 1602 and PLD 604 may include multiple sets of DQ/DQS lines. Memory device 1602 also supplies a system clock SYSCLK to PLD 1604 in addition to other control signals. PLD 1604 is designed with the modular DDR I/O interface as described above. PLD 1604 may be configured to perform any user-defined functionality such as a microprocessor, digital signal processor, network processor, or the like.

The foregoing description of specific embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated.

What is claimed is:

1. A method of delaying a clock signal for a multiple-data-rate interface on an integrated circuit, the method comprising:
   receiving a first edge of a first clock signal;
   generating a first edge of a second clock signal by delaying the first clock signal by a first duration;
   receiving a next edge of the first clock signal and the first edge of the second clock signal, the next edge of the first clock signal following the first edge of the first clock signal;
   receiving a third clock signal at a pad of the integrated circuit;
   generating a fourth clock signal by delaying the third clock signal by a second duration and selectively providing either the third clock signal or the delayed third clock signal; and
   increasing the first and second durations if the first edge of the second clock signal is received before the next edge of the first clock signal, else decreasing the first and second durations.

2. The method of claim 1 further comprising:
   storing a data signal when the fourth clock signal transitions from a first logic level to a second logic level, and storing the data signal when the fourth clock signal transitions from the second logic level to the first logic level.

3. The method of claim 1 wherein the second duration is approximately equal to one-quarter the first duration.

4. The method of claim 1 wherein the multiple-data-rate interface is a double-data-rate interface.

5. The method of claim 1 wherein next edge of the first clock follows the first edge of the first clock by a clock cycle of the first clock.

6. A method of delaying a clock signal for a multiple-data-rate interface comprising:
   receiving a first edge of a first clock signal;
   generating a first edge of a second clock signal by delaying the first clock signal by a first duration and dividing the frequency of the first clock signal;
   receiving a next edge of the first clock signal and the first edge of the second clock signal, the next edge of the first clock signal following the first edge of the first clock signal;
   receiving a third clock signal;
   generating a fourth clock signal by delaying the third clock signal by a second duration;
   comparing a phase of the first edge of the second clock signal and the next edge of the first clock signal to generate a count; and
   increasing the first and second durations by changing the count in a first direction if the first edge of the second clock signal is received before the next edge of the first clock signal, else decreasing the first and second durations by changing the count in a second direction.

7. The method of claim 6 further comprising:
   storing a data signal when the fourth clock signal transitions from a first logic level to a second logic level, and storing the data signal when the fourth clock signal transitions from the second logic level to the first logic level.

8. The method of claim 6 wherein the second duration is approximately equal to one-quarter the first duration.

9. The method of claim 6 wherein the multiple-data-rate interface is a double-data-rate interface.

10. The method of claim 6 wherein next edge of the first clock follows the first edge of the first clock by a clock cycle of the first clock.

11. The method of claim 6 wherein the first clock signal is divided in frequency then delayed by the first duration.

12. The method of claim 11 wherein the frequency of the first clock signal is divided in frequency by a value selected from the group consisting of 4, 8, and 16.

13. The method of claim 6 wherein the first clock signal is delayed by the first duration before its frequency is divided.

14. A method of receiving a data signal at a double data rate interface, the method comprising:
   receiving a first clock signal;
   delaying the first clock signal by a first delay using a first variable delay block;
   comparing a phase of the first clock signal with a phase of the delayed first clock signal;

using the phase comparison to vary a count provided by a counter;

receiving a data signal at a data input of a double data rate register;

receiving a second clock signal at a clock input of the double data rate register; and adjusting a second delay between the data signal at the data input of the double data rate register and the second clock signal at the clock input of the double data rate register using a second variable delay block separate from the first variable delay block, wherein the first delay and the second delay are adjusted by the count provided by the counter.

15. The method of claim 14 further comprising:

clocking a first register of the double data rate register with falling edges of the second clock signal; and clocking a second register of the double data rate register with rising edges of the second clock signal.

16. The method of claim 14 wherein the counter is an up/down counter.

17. The method of claim 14 wherein the second delay block may be selectively bypassed.

18. The method of claim 14 wherein the first variable delay block comprises four times the number of delay elements as the second variable delay block.

19. The method of claim 14 wherein the second delay is approximately equal to one-quarter the first delay.

20. The method of claim 14 wherein the count is incremented or decremented as a result of the phase comparison.

21. The method of claim 14 further comprising:

receiving an output of the double data rate register using a first-in-first-out memory.

22. A method of receiving a data signal comprising:

adjusting a first variable delay between the data signal and a first clock signal;

registering the data signal with rising edges of the first clock signal;

registering the data signal with falling edges of the first clock signal;

receiving a second clock signal and delaying the second clock signal by a second variable delay;

comparing a phase of the second clock signal and the delayed second clock signal to generate a count; and adjusting the first variable delay and the second variable delay using the count.

23. The method of claim 22 wherein the count is provided by an up/down counter.

24. The method of claim 22 wherein the second variable delay may be selectively bypassed.

25. The method of claim 22 wherein the first variable delay is approximately equal to one-quarter the second variable delay.

26. The method of claim 22 wherein the count is incremented or decremented as a result of the phase comparison.

27. A method of receiving a data signal on an integrated circuit, the method comprising:

receiving a first clock signal;

delaying the first clock signal by a first delay using a first variable delay block;

comparing a phase of the first clock signal with a phase of the delayed first clock signal;

receiving a data signal at a data input of a double data rate register;

receiving a second clock signal from an input buffer coupled to a pad of the integrated circuit;

delaying the second clock signal by a second delay using a second variable delay block, where the second variable delay block is separate from the first variable delay block; and selectively providing either the second clock signal or the delayed second clock signal to a clock input of the double data rate register, wherein the first delay and the second delay are adjusted by the phase comparison.

28. The method of claim 27 further comprising:

clocking a first register of the double data rate register with falling edges of the selected second clock signal or delayed second clock signal; and clocking a second register of the double data rate register with rising edges of the selected second clock signal or delayed second clock signal.

29. The method of claim 27 wherein the phase comparison varies a count provided by an up/down counter.

30. The method of claim 27 wherein the first variable delay block comprises four times the number of delay elements as the second variable delay block.

31. The method of claim 27 wherein the second delay is approximately equal to one-quarter the first delay.

32. The method of claim 27 further comprising:

receiving an output of the double data rate register using a first-in-first-out memory.

* * * * *